US006472876B1

(12) United States Patent
Notohamiprodjo et al.

(10) Patent No.: US 6,472,876 B1
(45) Date of Patent: Oct. 29, 2002

(54) SENSING AND BALANCING CURRENTS IN A BALLAST DIMMING CIRCUIT

(75) Inventors: Hubertus Notohamiprodjo, Union City, CA (US); Thomas Marinelli, Wolfurt (AT)

(73) Assignee: Tridonic-USA, Inc., Norcross, GA (US)

( * ) Notice: Subject to any disclaimer, the term of this patent is extended or adjusted under 35 U.S.C. 154(b) by 0 days.

(21) Appl. No.: 09/564,577

(22) Filed: May 5, 2000

(51) Int. Cl.[7] ........................ G01R 31/00; H05B 39/00; H05B 37/02

(52) U.S. Cl. ........................ 324/414; 324/414; 315/98; 315/219

(58) Field of Search .......................... 324/414; 315/219, 315/98, 224, 283, 291

(56) References Cited

U.S. PATENT DOCUMENTS 4,277,726 A * 7/1981 Burke ........................ 315/98
4,441,054 A * 4/1984 Bay ........................... 315/219
4,622,496 A * 11/1986 Dattilo et al. ............... 315/283
RE33,057 E * 9/1989 Clegg et al. ................ 315/224
4,902,942 A * 2/1990 El-Hamamsy .............. 315/276
5,982,253 A * 11/1999 Perrin et al. ................ 333/182
6,028,400 A * 2/2000 Pol et al. ..................... 315/225
6,100,651 A * 8/2000 Ohtsuka ...................... 315/279
6,104,147 A * 8/2000 Nakmura et al. ........... 315/289
6,114,814 A * 9/2000 Shannon et al. ............ 315/219
6,118,228 A * 9/2000 Pa'l ........................... 315/307
6,121,734 A * 9/2000 Scabados .................... 315/291

* cited by examiner

*Primary Examiner*—N. Le
*Assistant Examiner*—Wasseem H. Hamdan
(74) *Attorney, Agent, or Firm*—Burns Doane Swecker & Mathis, L.L.P.

(57) ABSTRACT

The present invention is directed to accurately sensing and regulating lamp current, and thus lamp output, over a range of lamp outputs, down to and below 10% of total lamp output. Exemplary embodiments can be used with a single set of power elements to drive multiple lamps in either an isolated or a non-isolated condition.

20 Claims, 3 Drawing Sheets

SENSING AND BALANCING CURRENTS IN A BALLAST DIMMING CIRCUIT

BACKGROUND OF THE INVENTION

1. Field of the Invention

The present invention relates generally to ballast circuits, and more particularly, to dimming ballast circuits used to selectively adjust the light output of flourescent lamps to provide a dimming range that can extend down to and below 10% of total lamp output.

2. Background Information

Dimming ballast circuits generally fall into one of two categories: isolated output dimming ballast circuits such as that of FIG. 1; and non-isolated output dimming ballast circuits such as that of FIG. 2. Dimming is achieved by controlling the frequency or pulse width of the current supplied to the lamps. For example, frequencies are controlled over a range of, for example, 20 kiloHertz (kHz) to approximately 100 kHz, with full lamp output being provided at approximately 20 kHz.

Because of interference with other systems, such as remote control devices, which can be caused in and around the 20 kHz portion of the frequency bandwidth, the frequency of the current is typically controlled within a range of 40 to 120 kHz. At these high frequencies, current can leak to ground via air due to a capacitive effect. The result is that the lamp ballast cannot produce a dimming of the lamp below 10%.

In addition, multiple lamps are often configured in series. To balance illumination between the lamps, it is necessary to accurately measure lamp current through the series connected lamps. However, the series configuration of the lamps includes interwiring and interwinding capacitance, which precludes accurate current measurements.

FIG. 1 shows an example of an isolated dimming ballast circuit 102 associated with multiple lamps 104 and 106. Isolated output dimming ballast circuits use a magnetic coupling component, such as galvanic separation, to sense the load current of lamps driven by the ballast circuit. Accordingly, the dimming ballast circuit 102 includes a current regulation control circuit 108 connected to a power switch (not shown) and a sensing circuit 110. The control circuit 108 includes a resonant inductor 112 in series with the primary winding 114 of a transformer 118 having a secondary winding 116 coupled in series with the lamps 104 and 106. A resonant capacitor 120 is connected in parallel with the primary winding 114. The sensing circuit 110 includes a Schottky diode 122 connected in series with the secondary winding 124 of a current sensing transformer 126 having a primary winding 128 connected in series with the lamps 104 and 106. A resistor R1 labeled 130 is connected in series with the secondary winding 124.

Because the isolated ballast circuit of FIG. 1 is subject to high interwinding and interwiring capacitance, multiple lamp configurations cannot be dimmed below 10%, such that the current sensing loses accuracy. For example, interwinding capacitances such as $C_{wdg}$ exist between the primary and secondary windings of each of the transformers 118 and 126. Interwiring capacitances such as $C_{wdg}$ exist among the various conductors of the ballast circuit. In addition, parasitic capacitances such as $C_p$ exist in the air due to leakage from the lamps 104 and 106 to ground. The value of these capacitances can vary with frequencies with, for example, increased capacitance being associated with increased frequency. These capacitances create current leakage paths.

The effect of current leakage in a dimming ballast circuit due to parasitic capacitances at high lamp operating frequencies can be demonstrated by the following: assume the total lamp current through the lamps 104 and 106 is 500 milliamps (mA) at full (i.e., 100%) light output, with the loss at the lamp 106 being 2 mA and the loss at lamp 104 being 1 mA (i.e., 497 mA actually passes through the lamps 104 and 106). At 10% of the total light output, where frequency of the supply current has been increased, assume total current through the lamps is 50 mA, with the loss at lamp 106 being approximately 4 mA, and the loss at lamp 104 being approximately 2 mA (i.e., 44 mA actually passes through the lamps). The differing losses at each of the two lamps will not produce a noticeable difference in light output from the two lamps at 100% light output. However, at 10% of total light output, a noticeable difference in the light output will be produced from each of the lamps (i.e., an imbalance in lamp output).

An additional problem occurs when an attempt is made to further dim the lamp below 10%. For example, at 1% of total light output, where frequency has been increased even further, assume that total lamp current is 5 mA. The loss at lamp 106 will increase above the 4 mA loss experienced at 10% of total output, and the loss at lamp 104 will increase above the 2 mA. Thus, at 1% of total light output, the lamp losses exceed the total available current, such that the lamps are extinguished and dimming cannot even be achieved.

FIG. 2 shows an exemplary non-isolated dimming ballast circuit 202 associated with multiple lamps 204 and 206 connected in parallel. The ballast circuit 202 includes a current regulation control circuit having parallel resonant inductors 208 and 210 connected between a power switch and each of the lamps 204 and 206, respectively. Resonant capacitors 212 and 214 are connected in parallel with each of the lamps 204 and 206, respectively. A sensing circuit 218 of the dimming ballast includes a first resistor 220 and a second resistor 222 connected to each of the lamps 204 and 206, respectively for providing current measurement.

The use of a parallel lamp configuration as shown in FIG. 2 avoids some of the detrimental effects due to interwiring and interwinding capacitance. However, parasitic capacitances can result in current imbalances and current losses which produce effects similar to those described with respect to FIG. 1. In addition, when non-isolated dimming ballast circuits as shown in FIG. 2 are used, a non-common wiring (such as an 8-wire configuration) is used versus US standard ANSI wiring (6 wires). That is, where multiple lamps are used in a non-isolated dimming ballast circuit, 8 wires are used to connect all cathodes and to separately sense current in each lamp independently so that current imbalances can be compensated.

Accordingly, it would be desirable to provide a dimming ballast circuit which can accurately sense and control current in each of multiple lamps independently to permit dimming over an entire range of total lamp output, down to and below 10% of total lamp output, in such a manner that the lamp outputs remain balanced. It would also be desirable to provide such a capability using standard US wiring configurations.

SUMMARY OF THE INVENTION

The present invention is directed to accurately sensing and regulating lamp current, and thus lamp output, over a range of lamp outputs, down to and below 10% of total lamp output. Exemplary embodiments can be used with a single set of power elements to drive multiple lamps in either an isolated or a non-isolated condition.

Generally speaking, exemplary embodiments are directed to a method and apparatus for controlling a ballast circuit comprising means for sensing current at each of multiple outputs of a ballast circuit configured to supply current to each lamp to be driven; and means for balancing current among each of said multiple outputs.

BRIEF DESCRIPTION OF THE DRAWINGS

Other objects and advantages of the present invention will become more apparent to those skilled in the art upon reading the detailed description of the preferred embodiments, wherein like elements have been designated by like numerals, and wherein.

DETAILED DESCRIPTION OF THE PREFERRED EMBODIMENTS

Figure 1:
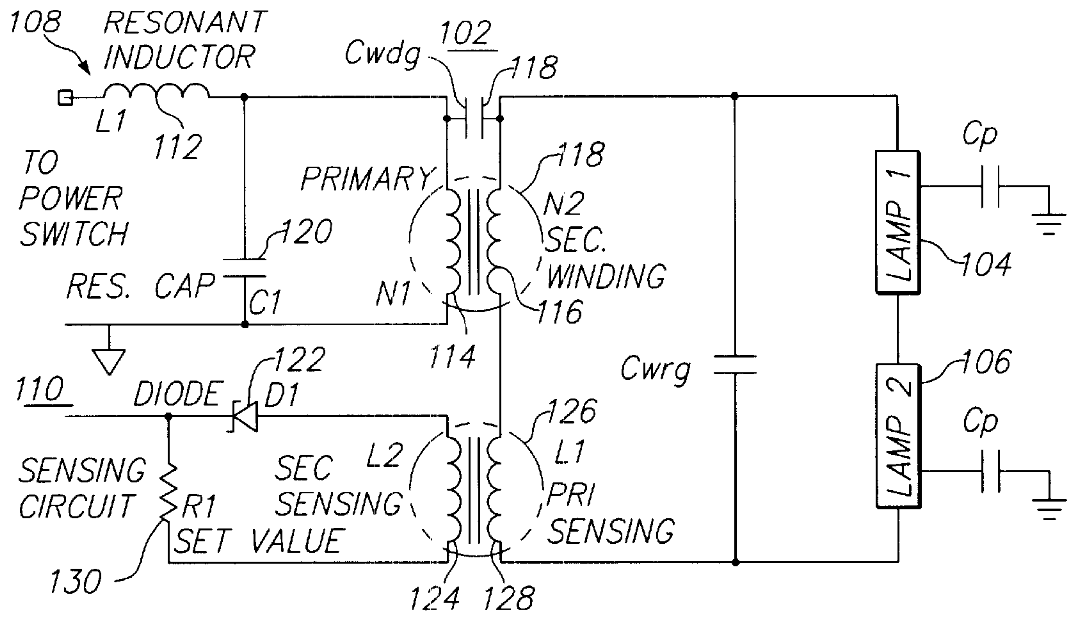
FIG. 1 PRIOR ART
FIG. 1 shows a prior art isolated dimming ballast circuit.
Figure 2:
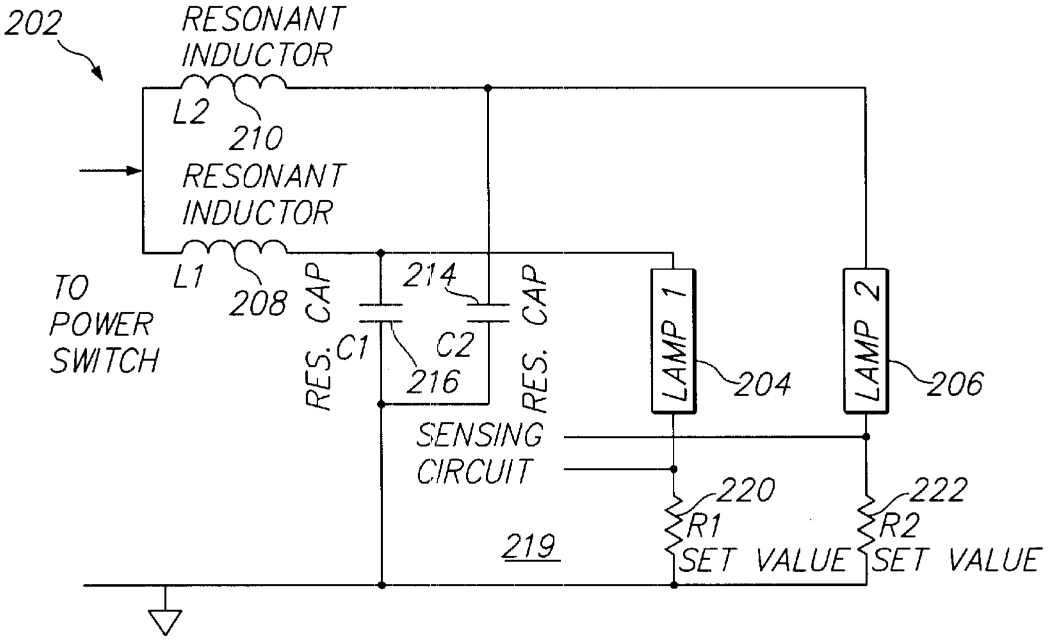
FIG. 2 PRIOR ART
FIG. 2 shows a prior art non-isolated dimming ballast circuit.
Figure 3:
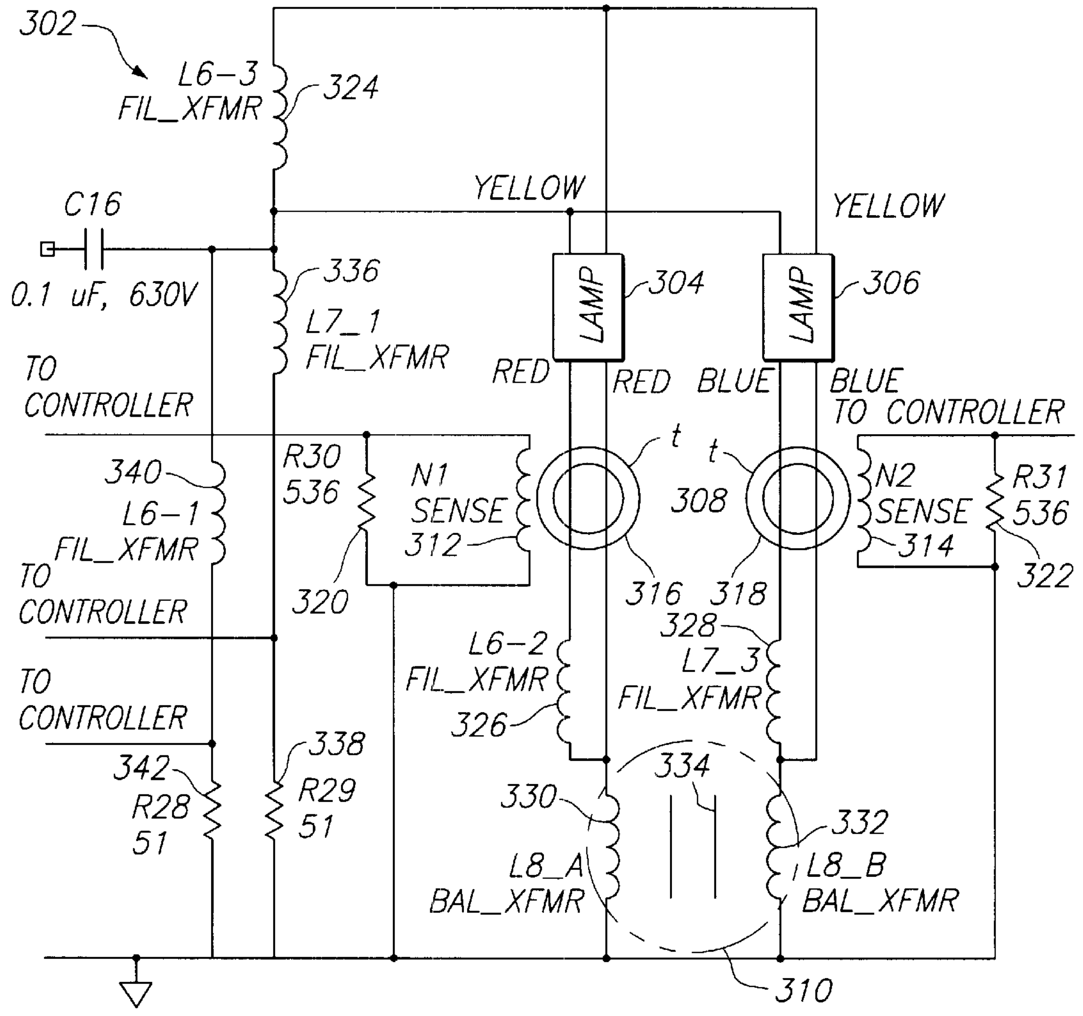
FIG. 3 shows an exemplary embodiment of the present invention.

FIG. 3 shows an exemplary embodiment of an apparatus for controlling a ballast circuit, represented as a dimming ballast circuit 302 associated with parallel connected lamps 304 and 306. The dimming ballast circuit 302 includes a means for sensing current at each of multiple outputs of the ballast circuit, represented as a current sensing circuit 308 configured to sense current of each lamp to be driven. The ballast circuit 302 also includes means for balancing current among each of the multiple outputs of the ballast circuit, the current balancing means being represented in the FIG. 3 embodiment as a current balancing circuit 310.

In the exemplary FIG. 3 embodiment, the current sensing circuit 308 includes at least one magnetic coupling winding to sense current at each of the multiple outputs. More particularly, the current sensing circuit 308 includes magnetically coupled windings N1 and N2, labeled 312 and 314, respectively. Each of the magnetically coupled windings is associated with a magnetic device, such as the toroids 316 and 318, respectively. In addition, each of the magnetically coupled windings is associated with a parallel resistor 320 and 322, respectively to establish a resonant LR circuit for each of the magnetically coupled windings. The use of the magnetically coupled windings as illustrated in the exemplary FIG. 3 embodiment permits a common mode measurement of current among the two lamps to be determined based on independent and separate measurements of each lamp's current.

Those skilled in the art will appreciate that although the magnetically coupled windings 312 and 314 are associated with toroids in the exemplary FIG. 3 embodiment, any magnetic device can be used in accordance with the present invention. For example, a transformer core of magnetically permeable material such as iron, sheet metal, ferrite, or any other magnetically permeable material, can be used. Moreover, any magnetic device which can measure the common mode current can be used in accordance with exemplary embodiments of the present invention including, but not limited to, any magnetic device, or any operational amplifier configuration (e.g., differential configuration).

In the exemplary FIG. 3 embodiment, the magnetically coupled windings 312 and 314 can each include any number of turns. In one embodiment, each includes four turns for the sensing current, coupled to 100 turns for establishing desired signal voltage that is sent to the current controller. Both of the magnetically coupled windings 312 and 314 can, for example, be wound with any wire including, but not limited to 29 AWG on EE 11.6 cores with no gap. The resistors 320 and 322 can be used to convert from current to voltage, with voltage across each resistor being equal to (N100*I)/(N4*R) wherein I is the current value and R is the resistor value, N designating the number of turns.

The current is sensed in the exemplary FIG. 3 embodiment via common mode measurement in a path of filament heating current. By using a common mode measurement technique, current sensing can take place closer to each respective lamp, to minimize capacitance leakage current.

The magnetically coupled windings 312 and 314 sense the current in each respective lamp, and supply this information to the current balancing circuit 310. For example, if capacitance leakage current were to exit a filament transformer winding 324 associated with each of the lamps 304 and 306 (e.g., from the filament winding 324 to ground), resulting in a decrease of lamp current, the magnetically coupled winding 312 would sense a current decrease in lamp 304 and send a correct current sense signal to a controller via the current balancing circuit 310, such that lamp current can be regulated. Similarly, if capacitive leakage were to occur from either lamp to the ground plane, current out of the magnetically coupled windings 312 and 314 would be similarly reduced and detected, such that the controller could again take corrective action via the current balancing circuit 310.

If current leakage were to occur from filament windings associated with lamps 304 and 306, such as filament windings 326 and 328 which constitute the secondary windings of cathode heating transformers, or from windings included in the current balancing circuit 310 (such as transformer windings 330 or 332), current sensing via the magnetically coupled windings 312 and 314 would remain unaffected. This absence of any affect on the sensed current is desired, so that leakage current will not affect lamp current regulation. It is a common mode current measurement based on current through the lamps which is used in accordance with exemplary embodiments of the present invention to achieve balanced operation.

The current balancing circuit 310 can be any magnetically coupled element, such as a transformer 334 having windings 330 and 332. The use of a balancing transformer permits a single set of power elements to be used with respect to each lamp.

In the FIG. 3 embodiment, windings 336 and 340 constitute primary windings of the cathode heating transformers. Filament windings 326 and 328 are the secondary windings of these transformers. These cathode transformers supply the cathodes additional heating current needed for a dimming operation. Resistors 338 and 342 sense the primary current of these cathode heating transformers to determine if cathodes are present.

The cathodes represent a load to the cathode heating transformers. This load is transformed from the secondary side to the primary side of each cathode heating transformer in accordance with the square of the windings ratio of primary winding 336 (labeled L7-1) to secondary winding 328 (labeled L7-3), or with the ratio of primary winding 340 (labeled L6-1) to the secondary winding 326 (labeled L6-2). If the load (i.e., cathode) changes, then the primary current changes, and this information can be sent to a control circuit (e.g., a control integrated circuit, not shown). Thus, a change in primary current caused by a change of the load (cathode) is detected.

In one embodiment, the transformer 334 of the current balancing circuit 310 is configured using EF 20 cores and bobbin and 350 turns of 28 AWG wire, divided into two separate windings of equal turns. The use of an equal number of turns in the two windings results in an autoregulating function. When the current in one winding is less than the current in the other winding, the transformer 334 produces an inductive excitation voltage across the winding which drives a higher current in the corresponding lamp. Because the winding on the other side of the transformer is balanced, it drives an equal but opposite voltage which will reduce current in the corresponding lamp, thereby causing currents in the two lamps to be equal.

An exemplary embodiment as illustrated in FIG. 3 achieves dimming over an entire range down to and below 10% of total lamp output, and permits dimming and startup of a fluorescent multilamp configuration using a 6 wire ballast in accordance with US standards over the entire range of lamp output. The exemplary embodiment senses arc current of each lamp independently and reacts to maintain current in each lamp balanced, such that even light output is achieved from both lamps. The exemplary FIG. 3 embodiment measures arc current ($I_{A1}$, $I_{A2}$) of each lamp, and uses the cathode heating transformers for heating cathodes of each lamp with a heating current ($I_H$). In each toroid, the heating current $I_H$ flows in equal and opposite directions, and is canceled out leaving only the arc current in the toroid. Therefore, only the arc current is sensed at the output of each toroid (i.e., for each toroid, a value is output for each lamp which corresponds to $I_A$).

As illustrated in the FIG. 3 embodiment, measured current outputs are supplied to a controller, which can be any readily available controller. That is, any controller which can receive sensed current and produce suitable indications of sensed current to achieve a desired current setpoint can be used. Exemplary embodiments of the present invention can work with lamps whose output is controlled in response to frequency regulation and/or duty cycle control. Those skilled in the art will appreciate that the controller can, but need not, provide current regulation, because the balancing circuit provides a self regulation capability.

The controller can, for example, be used in known fashion to provide current feedback for achieving a desired start and/or dimming value of the total light output. That is, total current can be compared against a controlled setpoint to achieve a desired dim factor. In addition, current can be compared against a setpoint (analog or digital) to avoid lamp flash during lamp ignition.

Lamp flash is a problem associated with fluorescent lamps which occurs when the lamps are turned on at low dim levels. Lamp flash is avoided in accordance with exemplary embodiments of the present invention, because a fluorescent lamp can be ignited at any value, even at very low levels, due to measurement of real arc current.

Figure 4:
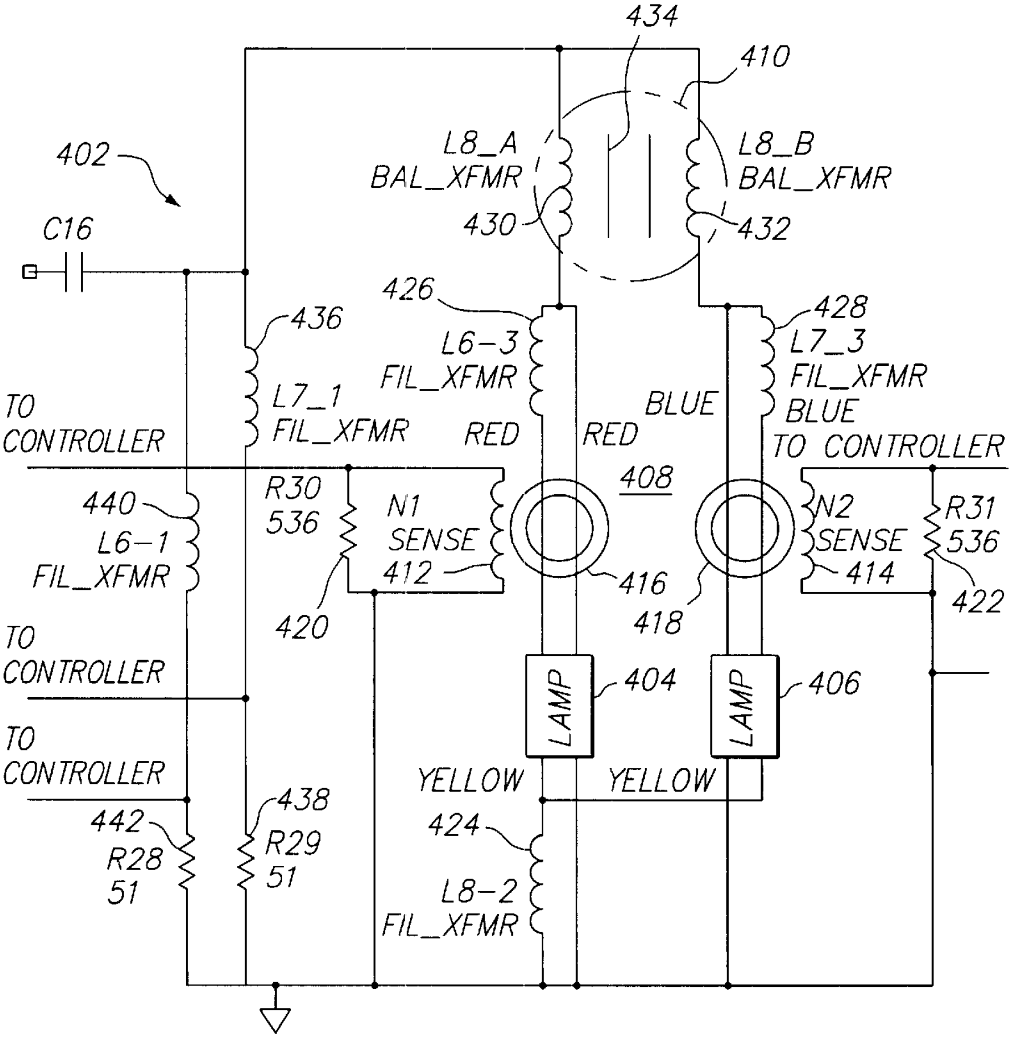
FIG. 4 shows an alternate exemplary embodiment of the present invention.

FIG. 4 illustrates an alternate exemplary embodiment of the present invention wherein elements similar to those of FIG. 3 are labeled with a numeral increased by 100. In the FIG. 4 example, the balancing transformer 434 is placed on a high side (i.e., supply side) of the lamps, and a common connection of the lamps is on the ground side of the lamps. The magnetically coupled windings of the current sensing circuit 408 are also placed on the high side of the lamps, just before the lamps in the exemplary embodiment illustrated.

The FIG. 4 configuration limits current leakage from the lamps to the ground because the lamps are located closer to the ground. In addition, if the balancing transformer 434 and/or filament windings 426, 428 have current leakage to ground, then the magnetically coupled windings 412 and 414 used for current detection will sense less current and the controller will compensate to keep the current at the correct level.

Those skilled in the art will appreciate that the FIG. 3 and FIG. 4 embodiments are exemplary only, and that numerous variations exist. For example, inventive features of the present invention can be used in conjunction with any number of lamps (i.e., one or more) used in any configuration (i.e., serial, parallel or any combination of serial and parallel).

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Apparatus for controlling a ballast circuit comprising:

means for sensing current at each of multiple outputs of a ballast circuit which is configured to receive current of each lamp to be driven, wherein first and second outputs from the ballast circuit are provided for connecting to a first lamp and third and fourth outputs from the ballast circuit are provided for connecting to a second lamp; and means for balancing current among each of the multiple outputs, using at least one magnetically coupled winding to balance current among each of said multiple outputs, wherein said magnetically coupled winding is formed in a transformer having at least first and second transformer windings.

2. Apparatus according to claim 1, wherein said current sensing means comprises:

at least one magnetically coupled winding to sense current at each of said multiple outputs.

3. Apparatus according to claim 1, wherein said current sensing means includes:

common mode measurement means placed in a path of filament heating current supplied to each of the multiple outputs.

4. Apparatus according to claim 3, wherein a magnetically coupled winding is provided for each of plural current sensors, and each magnetically coupled winding is located adjacent to a lamp driven by one of said multiple outputs.

5. Apparatus according to claim 4, wherein each magnetically coupled winding includes at least four turns for a sensing current and at least 100 turns for establishing a desired sensing voltage.

6. Apparatus according to claim 1, wherein the number of turns in each of said first and second transformer windings are equal.

7. Apparatus according to claim 1, wherein said current balancing means includes:

multiple windings, each of said multiple windings being series connected within different paths of said multiple outputs, and being magnetically coupled to one another.

8. Apparatus according to claim 1, in combination with multiple lamps and a ballast, comprising:

at least two lamps connected in parallel and driven by said ballast.

9. Apparatus according to claim 8, wherein each of said multiple outputs are current supply paths for supplying current to one of the two lamps connected to said ballast, said current balancing means being located in said current supply paths on a current supply side of said lamps.

10. Apparatus according to claim 8, wherein each of said multiple outputs are current supply paths for supplying current to one of the two lamps connected to said ballast, said current balancing means being located in said current supply paths on a current return side of said lamps.

11. Apparatus according to claim 10, wherein said current return side is a common ground of said apparatus.

12. A ballast circuit comprising:

first and second outputs from the ballast circuit for connecting to a first lamp;

third and fourth outputs from the ballast circuit for connecting to a second lamp;

a first winding within a first current path for the first and second output;

a second winding within a second current path for the third and fourth output; and wherein the first and second windings are magnetically coupled for balancing currents of the first and second current paths.

13. The ballast circuit according to claim 12, comprising:

a third winding magnetically coupled with the first current path;

a fourth winding magnetically coupled with the second current path; and a controller for receiving a first voltage from the third winding and a second voltage from the fourth winding.

14. The ballast circuit according to claim 13, wherein the controller is for dimming the first and second lamps.

15. The ballast circuit according to claim, 14, wherein the ballast circuit is a six wire ballast.

16. The ballast circuit according to claim 13, wherein the ballast circuit is a six wire ballast.

17. The ballast circuit according to claim 12, wherein the first and second windings are in a transformer.

18. The ballast circuit according to claim 17, wherein the ballast circuit is a six wire ballast.

19. The ballast circuit according to claim 12, wherein the ballast circuit is a six wire ballast.

20. Method for controlling a ballast, wherein first and second outputs from the ballast circuit are provided for connecting to a first lamp and third and fourth outputs from the ballast circuit are provided for connecting to a second lamp, the method comprising the steps of:

sensing current at each of multiple outputs of a ballast circuit which is configured to receive current of each lamp to be driven; and balancing current among each of said multiple outputs, using at least one magnetically coupled winding to balance current among each of said multiple outputs, wherein said magnetically coupled winding is formed in a transformer having at least first and second transformer windings.

* * * * *